United States Patent [19]
Kurihara et al.

[11] Patent Number: 5,495,493
[45] Date of Patent: Feb. 27, 1996

[54] SEMICONDUCTOR LASER DEVICE

[75] Inventors: Haruki Kurihara, Tokyo; Hatsumi Matsuura, Kawasaki, both of Japan

[73] Assignee: Kabushiki Kaisha Toshiba, Kawasaki, Japan

[21] Appl. No.: 325,118

[22] Filed: Oct. 18, 1994

[30] Foreign Application Priority Data

Oct. 20, 1993 [JP] Japan ................................. 5-262210

[51] Int. Cl.⁶ .................................................. H01S 3/18
[52] U.S. Cl. ................................ 372/46; 372/44; 372/33
[58] Field of Search ................................ 372/43, 44, 45, 372/46, 33

[56] References Cited

U.S. PATENT DOCUMENTS 5,144,633  9/1992  Ohnaka et al. ........................ 372/45

FOREIGN PATENT DOCUMENTS

| 0440471A3 | 8/1991 | European Pat. Off. . |
| 3410793A1 | 10/1984 | Germany . |
| 55-110090 | 8/1980 | Japan . |
| 57-034380 | 2/1982 | Japan . |
| 62-200785 | 9/1987 | Japan . |
| 62-200786 | 9/1987 | Japan . |
| 2283088 | 11/1990 | Japan . |
| 4-23379 | 1/1992 | Japan . |
| 4-309278 | 10/1992 | Japan . |
| 5145171 | 6/1993 | Japan . |

*Primary Examiner*—Rodney B. Bovernick
*Assistant Examiner*—Robert McNutt
*Attorney, Agent, or Firm*—Finnegan, Henderson, Farabow, Garrett & Dunner

[57] ABSTRACT

According to a semiconductor laser device of the present invention, the thickness and carrier concentration of a current blocking layer are set so as to cause a punch through on the current blocking layer when the semiconductor laser device is driven at a current which is one to ten times as large as a maximum rated value of a DC driving current. Both a light absorbing layer and a photocurrent blocking layer are formed between the current blocking layer and a second clad layer in order to prevent a light turn-on phenomenon from occurring. The light absorbing layer contacts the second clad layer and is constituted of a semiconductor crystal of a p-type conductivity type, which is undoped or has a low concentration. The photocurrent blocking layer contacts the current blocking layer and is constituted of a semiconductor crystal of the p-type conductivity type. If the band gaps of the light absorbing layer, photocurrent blocking layer, and active layer are represented by $E_{ab}$, $E_{ocb}$, and $E_{ga}$, respectively, the following relationships are satisfied $E_{ab} \leq E_{ga}$, $E_{ocb} > E_{ga}$.

13 Claims, 5 Drawing Sheets

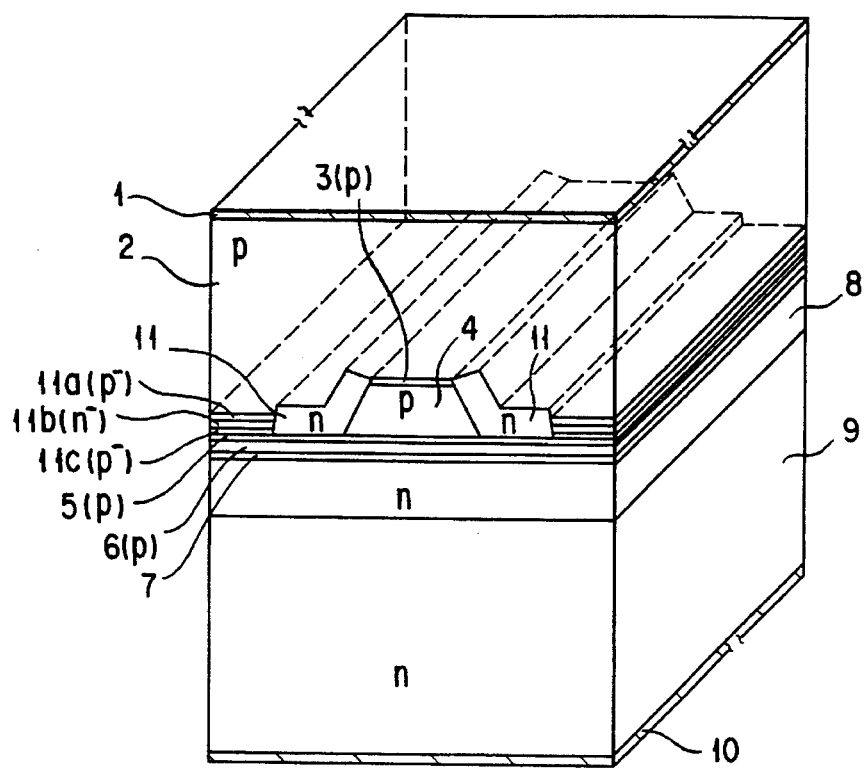
F I G. 9
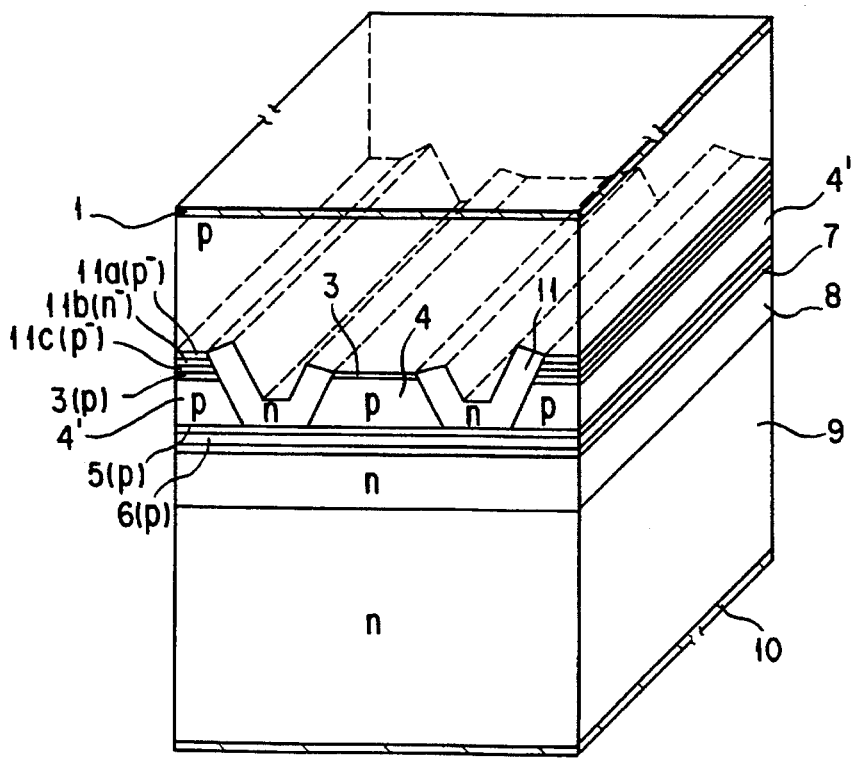
F I G. 10

SEMICONDUCTOR LASER DEVICE

BACKGROUND OF THE INVENTION

1. Field of the Invention

The present invention relates to a semiconductor laser device capable of emitting visible or near-infrared light and suitable for a light source in bar code readers, pointers, optical pickups, optical measuring instruments and the like, and more specifically to a semiconductor laser device having a so-called inner stripe structure, wherein driving currents flow through a stripe-shaped opening provided in a reversed pn-junction plane which extends along one side of a current blocking layer (CBL).

2. Description of the Related Art

FIG. 1 illustrates a structure of conventional semiconductor laser device, which is disclosed and called SBR structure or SBR laser in Jpn. Pat. Appln. KOKAI Publications Nos. 62-200785 and 62-200786 and etc.

In FIG. 1, reference numeral 1 indicates a metallic electrode on the p side; 2, a cap layer of p-type GaAs formed to reduce the contact resistance; 3–6, a second clad layer of p-type InGaAlP; 7, an active layer of InGaP; 8, a first clad layer of n-type InGaAlP; 9, a substrate of n-type GaAs; 10, a metallic electrode on the n side; and 11, a current blocking layer (CBL) of n-type GaAs.

The current supplied through the metallic electrode 1 flows through the cap layer 2, clad layers 3 to 6, active layer 7, clad layer 8, and substrate 9 in this order, and drains away through the metallic electrode 10. This current-flow is confined within a slit-shaped opening X formed in the current blocking layer 11. Therefore, it is the active layer just under the opening X, that is, directly under the ridge 4 where the current generates light gain.

Lasing is achieved by cooperation of the above light gain, optical resonator, and an optical slab-waveguide constituted of the clad layers 3 to 6, active layer 7 and clad layer 8.

The following are the dimensions and carrier concentrations of the main constituents of the SBR laser. The thickness of the CBL 11 is about 1.5 µm and the carrier concentration thereof is $3\times10^{18}$ cm$^{-3}$. The CBL has to be thicker than the hole diffusion length in it. Otherwise, electrons optically pumped in the CBL by the laser light compensate the depletion region of the reversed pn-junction and this junction eventually turns on (Photo-induced turn-on). Thickness of the active layer 7 is 0.02 to 0.08 µm. The clad layer 4 forms a ridge, the cross-section of which is trapezoid-shaped and 3 to 6 µm wide at the bottom. The total thickness of the clad layers 3 to 6 is 1 to 3 µm, while that of the clad layers 5 to 6 is 0.15 to 0.4 µm. The clad layer 8 is 1.0 to 1.5 µm thick. The length of an optical resonator, which is composed of opposed facet surfaces E1 and E2 is 400 to 800 µm. Though the current is effectively converted into laser light in the semiconductor laser device, still some part of it is changed into heat. The active layer re-absorbs the laser light, converts it such undesirable heat, and is heated up until it melts away at one or both of the facet surfaces E1 and E2. Thus, electrostatic discharges from an operator's body or work bench damage the laser device. So do spike currents generated when switching the power supply ON or OFF. Therefore, the care should be taken not to exceed, even momentarily, the laser device's maximum current rating.

EIAJ (Electronic Industries Association of Japan) shows a standard method to evaluate durability of semiconductor devices against these discharges and spike currents (surge currents), where the circuit shown in FIG. 2 is used.

The evaluating procedure is as follows. First, the mercury switch SW is set to the CHARGE position and the capacitor C of 200 pF is charged up to a voltage $V_c$ of any value set by the variable voltage source VR. Then, SW is turned to the DISCHARGE position so that the electric charge on C drains away through the tested semiconductor laser device LD. If this discharge does not give the LD any damage, that is, the LD shows the same characteristics as before, the voltage $V_c$ is set a little higher and the same procedure is repeated until the LD shows any damage. Surge-damaging-voltage $V_s$, defined as the value of $V_c$ that gives the LD the first damage, is practically useful as an index for the robustness of the LD.

Though surge-damaging-voltage $V_s$ greatly depends upon the structure ofisemiconductor laser devices, it generally ranges fairly low voltage of 20 to 80 V. SBR lasers are not the exception. Therefore, SBR lasers as well as semiconductor laser devices with other structures have to be handled very carefully not to be damaged by unintentional surge currents.

The electric resistance of SBR lasers is virtually equal to the resistance $R_s$ of the ridge 4, the about = 6 Ω. Therefore, the time constant of the discharge in the test circuit shows in FIG. 2 is about 200 pF×6 Ω= 1.2 nsec. This means that the discharge accomplishes within several nanoseconds. In such a short time interval, the critical surge current $I_s$ that causes a fatal damage on a semiconductor laser is considered to be in inverse proportion to the duration $\tau_s$ of the current. In other words, a semiconductor laser device is assumed to be damaged at a critical charge $q_s=I_s\tau_s$, which depends on the specific device structure. The above critical charge $q_s$ is estimated to be 4 to $16\times10^{-9}$ C by using the above values $V_s$=20 to 80 V and C= 200 pF. The existence of $q_s$ and its values have been confirmed by driving with rectangular current pulses, which damage semiconductor laser devices when the charge included in one pulse is nearly equal to the value of $q_s$ estimated above.

In Jpn. Pat. Appln. KOKAI Publication No. 4-309278, it is claimed that increased electric capacity of semiconductor laser devices improves their durability against surge currents. However, even if the structure disclosed there is used, the capacity of the device can be increased only five times as large as that of conventional devices at most. This increments is generally not enough to improve the durability of the device against surge currents, because time width of spike or pulse is generally still so short that the damage of the device is still ruled by the amount of charge which passes through the device in one spike or pulse as explained above. Consequently, it is concluded that in order to improve the durability of semiconductor laser devices against surge currents drastically, it is necessary to provide discharging paths other than the path through the ridge 4.

SUMMARY OF THE INVENTION

The object of present invention is to eliminate the above drawbacks and to provide a visible or near-infrared semiconductor laser device which is much more resistant to surge currents.

To attain the above object, a semiconductor laser device according to the present invention comprises: a substrate made up of semiconductor crystal of a first conductivity type; a first clad layer formed on the substrate and made up of a semiconductor crystal of the first conductivity type;

whose bandgap energy is $Eg_{c1}$ and refractive index is $n_{c1}$; an active layer formed on the first clad layer and made up of a semiconductor crystal of the first or second conductivity type, whose bandgap energy is $Eg_a$ and refractive index is $n_a$, where $Eg_{c1} > Eg_a$ and $n_{c1} < n_a$; a second clad layer formed on the active layer, having a ridge on its upper surface, and made up of a semiconductor crystal of the second conductivity type, whose bandgap energy is $Eg_{c2}$ and refractive index is $n_{c2}$, $Eg_{c2} > Eg_a$ and $n_{c2} < n_a$; a current blocking layer (CBL) formed on the second clad layer and made up of a semiconductor crystal of the first conductivity type; whose bandgap energy is $Eg_{cb}$, where $Eg_{cb} < Eg_a$; a slit-shaped current injection opening formed in the CBL and filled with the ridge; a cap layer formed on the CBL and the second clad layer exposed in the opening and made up of a semiconductor crystal of the second conductivity type; an upper electrode formed on the cap layer and made up of metals; and a lower electrode formed on the lower surface of the substrate and made up of metals.

The thickness and carrier concentration of the CBL are determined such that a reverse-biased pn-junction between the CBL and second clad layer breaks down when excess voltage is applied on the device. This breakdown is achieved by punch-through of the depletion region on the CBL-side. The breakdown voltage is chosen as 1 to 10 times as high as the maximum rated value of DC-driving voltage.

The thickness of the CBL determined in this manner is generally too thin to prevent the photo-induced turn-on of the reversed junction. To overcome this problem, two structures are disclosed in the present invention.

The first structure has a lamination composed of a photo-current blocking layer and light absorbing layer, which is inserted between the second clad layer and the CBL. The photo-current blocking layer is made up of a semiconductor crystal of the second conductivity type and forms a pn-junction with the CBL. The bandgap energy $Eg_{ocb}$ of the photo-current blocking layer is larger than the bandgap energy $Eg_a$ of the active layer. The light absorbing layer has smaller bandgap energy $Eg_{ab}$ than the active layer and forms a hetero-junction with the photo-current blocking layer. It is this hetero-junction that blocks optically induced currents from injecting majority carriers into the CBL and prevents the photo-induced turn-on. The light absorbing layer is made up of a semiconductor crystal of the second conductivity type with high resistivity, that is, very low carrier concentration.

When the first conductivity type is n and the second conductivity type is p, the light absorption layer is preferably constituted of p-type $Al_wGa_{1-w}As$ ($0 \leq w < 1$, and $p \leq 4 \times 10^{17}$ cm$^{-3}$).

The thickness of the CBL has to be less than a critical thickness given by the next equation.

$$d_{cb} = [2K\epsilon_{cb}R_{st}I_{max}/qN_{cb}]^{1/2}$$

where $N_{cb}$ is the impurity concentration of the CBL, $R_{st}$ is a resistance of the ridge, $I_{max}$ is the maximum DC-current rating, $\epsilon_{cb}$ is the dielectric constant of the CBL, q is the unit charge, and K is a parameter determining the durability against surge current ($1 \leq K \leq 10$). The critical thickness $d_{cb}$ for K=1 is equal to the thickness of the reverse-biased depletion region on the CBL side. Therefore, the reverse-biased junction is supposed to punch through when driving current exceed $KI_{max}$.

The second structure is substantially same as the conventional SBR laser except that it has thin portions in the CBL apart from the ridge. In these thin portions, the CBL is thinner than the above critical thickness $d_{cb}$. Because the thin portions locate too far to be pumped by laser light, the photo-induced turn-on can not be the problem.

In the present invention, the active layer, first clad layer, second clad layer, and photocurrent blocking layer are preferably constituted of $(Al_xGa_{1-x})_yIn_{1-y}P$, where $0 \leq x \leq 1$, x varies from layer to layer, and y is about 0.5 for each layer. The CBL is constituted of one of $(Al_xGa_{1-x})_yIn_{1-y}P$ and $Al_zGa_{1-z}As$. It is also preferable to sandwiches the thin (portions of) CBL by two diffusion preventing layers, which are so low doped as to prevent the dopants in adjacent layers from diffusion into the CBL, which has to be fairly low doped.

According to the foregoing structures in the present invention, most of the excess currents caused by surge currents detour the ridge and flow through the thin (portion of) CBL which has been punched through. Thus, discharging side-paths necessary to improve the durability against surge currents are successively provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 is a front view showing a structure of a semiconductor laser device according to a seventh embodiment of the present invention; and FIG. 10 is a front view showing a structure of a semiconductor laser device according to an eighth embodiment of the present invention.

DETAILED DESCRIPTION OF THE PREFERRED EMBODIMENTS

Figure 3:
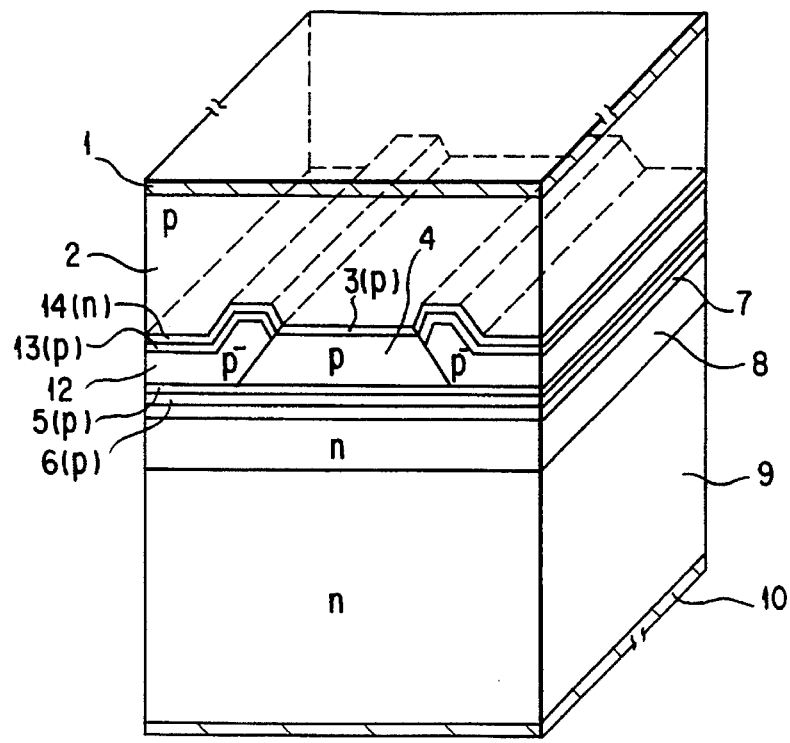
FIG. 3 is a front view showing a structure of a semiconductor laser device according to a first embodiment of the present invention.

FIG. 3 shows a structure of a semiconductor laser device according to a first embodiment of the present invention.

Figure 1:
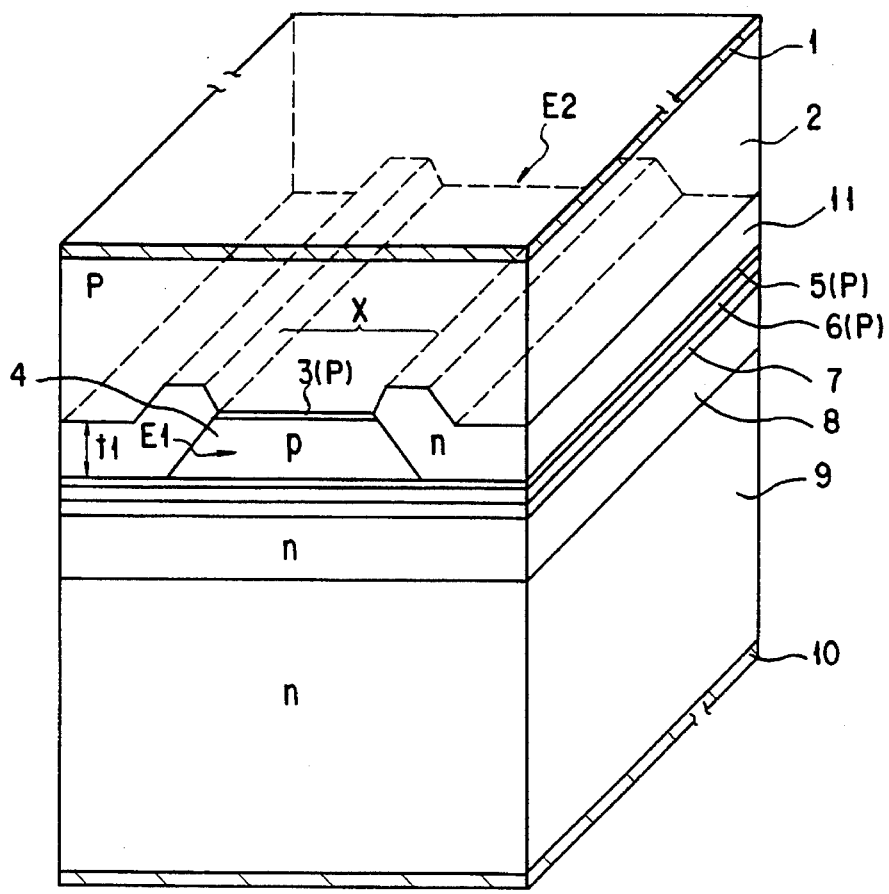
FIG. 1 is a front view showing a structure of a conventional semiconductor laser device.
Figure 2:
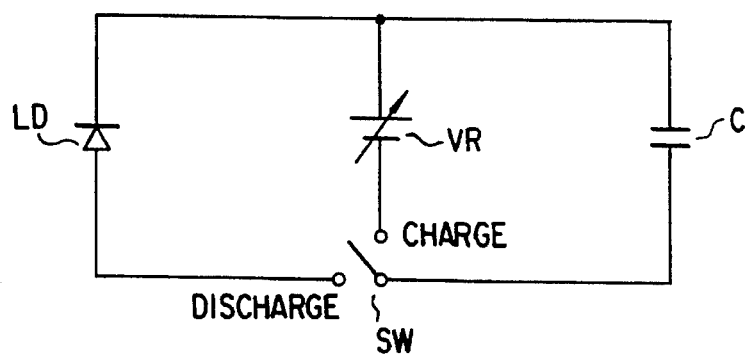
FIG. 2 is a circuit diagram showing a circuit for evaluating a surge damaging voltage of the semiconductor laser device.

The first embodiment is an improvement of the SBR structure shown in FIG. 1. In FIG. 3, the same structural elements as those of the device shown in FIG. 1 are denoted by the same reference numerals.

The feature of the semiconductor laser device of the first embodiment lies in that a layered structure including three layers is provided in place of the CBL 11 (shown in FIG. 1) of an n-type GaAs layer. The three layers are a p-type light absorbing layer 12, a p-type photocurrent blocking layer 13, and an n-type CBL 14 which are formed in this order on the second clad layer 5.

The light absorbing layer 12 has a function of absorbing light, the photocurrent blocking layer 13 serves to prevent electrons optically pumped in the light absorbing layer 12 from diffusing into the CBL, and the CBL 14 serves to block driving currents, by virtue of a reversed pn junction formed between the CBL 14 and photocurrent blocking layer 13.

In order to reduce the leakage currents through the light absorbing layer 12, its resistivity has to be about 1 $\Omega cm^{-1}$ or more. To satisfy this requirement the light absorbing layer 12 is constituted of $p^-$-type $Al_wGa_{1-w}As$ ($0 \leq w < 1$) having a carrier concentration of $4 \times 10^{17}$ $cm^{-3}$ or lower. The light absorbing layer 12 has to be thick enough to absorb most of the evanescent field of the laser light and to prevent the photo-induced turn-on of the CBL 14. Its typical thickness is about 1.5 μm.

The photocurrent blocking layer 13 is constituted of p-type $(Ga_{0.3}Al_{0.7})_{0.5}In_{0.5}P$ having a carrier concentration of $5 \times 10^{17}$ $cm^{-3}$, and its thickness is about 0.1 μm. A heterojunction is formed between the light absorption layer 12 and photocurrent blocking layer 13. This hetero-junction blocks optically induced currents and prevents the photo-induced turn-on of the CBL 14.

The carrier concentration and thickness of the photocurrent blocking layer 13 are determined, in view of the restrictions on the crystal growth technique required for forming the layer 13.

The current blocking layer 14 is constituted of n-type GaAs having a carrier concentration of $5 \times 10^{16}$ $cm^{-3}$, and its thickness is about 0.15 μm.

The relationship between the carrier concentration and thickness of the current blocking layer 14 are determined as follows.

The thickness $w_{cb}$ of a depletion layer formed in the reversed junction of the current blocking layer 14 is expressed by the following equation:

$$w_{cb} = [2\epsilon_{cb}(V_a + V_{bi})/qN_{cb}]^{1/2} \qquad (1)$$

where $\epsilon_{cb}$ is a dielectric constant of the current blocking layer, $V_a$ is a voltage applied to the pn-junction, $V_{bi}$ is a built-in potential of the pn-junction, q is a unit charge, and $N_{cb}$ is an impurity concentration of the current blocking layer.

The impurity concentration of the photocurrent blocking layer 13, which contacts the current blocking layer 14 to form the reversed junction, is much higher than that ($N_{cb}$) of the current blocking layer 14. The voltage $V_a$ is substantially equal to a potential drop ($R_{st}I_d$) at the ridge 4 where $R_{st}$ is a resistance of the ridge 4 and $I_d$ is a driving current. When surge currents damage a laser device, the potential drop $R_{st}I_s$ is generally much layer than the built-in potential $Vb_i$. ($I_s$ is the peak height of the surge currents). Therefore, $V_a + V_{bi}$ in the equation (1) can be substituted by $R_sI_s$ and the following equation is obtained:

$$w_{cb} = [2\epsilon_{cb}R_{st}I_s/qN_{cb}]^{1/2} \qquad (2)$$

If the thickness $d_{cd}$ of the CBL 14 is smaller than the thickness $w_{cb}$ of the depletion layer, expressed by the equation (2), the depletion layer punches through the CBL most of the surge currents detour the ridge 4 and flow through the CBL.

The ratio K of $I_s$ (the peak height of surge currents that damages the laser device) to $I_{max}$ (the maximum DC-current rating) generally ranges 1 to 10 depending on specific laser structure, wave shape of surge currents and so on. Therefore, the minimum thickness of the CBL 14, which are required to prevent the surge current breakage, is given by the following equation:

$$d_{cb} = [2K\epsilon_{cb}R_{st}I_{max}/qN_{cb}]^{1/2} \qquad (3)$$

where $1 \leq K \leq 10$.

When K is equal to 3 in the above equation (3), the carrier concentration of the current blocking layer 14 is $5 \times 10^{16}$ $cm^{-3}$, the thickness thereof is about 0.15 μm, and the surge deterioration voltage $V_s$ is 100 V or higher.

Even though the conductivity type of the semiconductor laser device shown in FIG. 3 is inverted, the same advantage can be obtained. In this case, however, the light absorption layer 12 is constituted of n-type GaAs having a carrier concentration of $2 \times 10^{16}$ $cm^{-3}$, and the sheet resistance of the layer 12 has to be increased as mentioned above.

Figure 4:
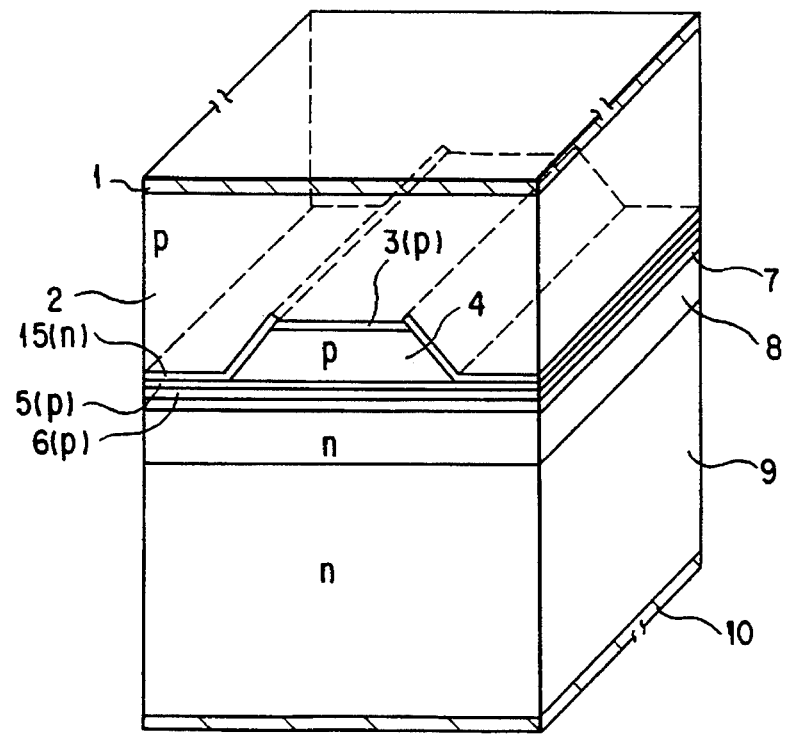
FIG. 4 is a front view showing a structure of a semiconductor laser device according to a second embodiment of the present invention.

FIG. 4 shows a structure of a semiconductor laser device according to a second embodiment of the present invention. The second embodiment is an improvement of the SBR structure shown in FIG. 1. In FIG. 4, the same structural elements as those of the device shown in FIG. 1 are denoted by the same reference numerals.

The feature of the semiconductor laser device of the second embodiment lies in that a current blocking layer 15 including $(Al_xGa_{1-x})_yIn_{1-y}P$ of an n-type conductivity, such as $(Al_{0.3}Ga_{0.7})_{0.5}In_{0.5}P$, is formed in place of the current blocking layer 11 (shown in FIG. 1) of an n-type GaAs layer having a thickness and a carrier concentration enough to prevent a light turn-on phenomenon.

The thickness of the current blocking layer 15 is about 0.1 μm, and the carrier concentration thereof is determined so as to satisfy the above equation (3). Since the thickness of the layer 15 is smaller than the wavelength of a laser beam, the light leaking from an active layer 7 is absorbed by p-type GaAs constituting a cap layer 2. Consequently, the semiconductor laser device according to the second embodiment allows an optical waveguide to be formed under a ridge 4 which features the SBR structure.

Figure 5:
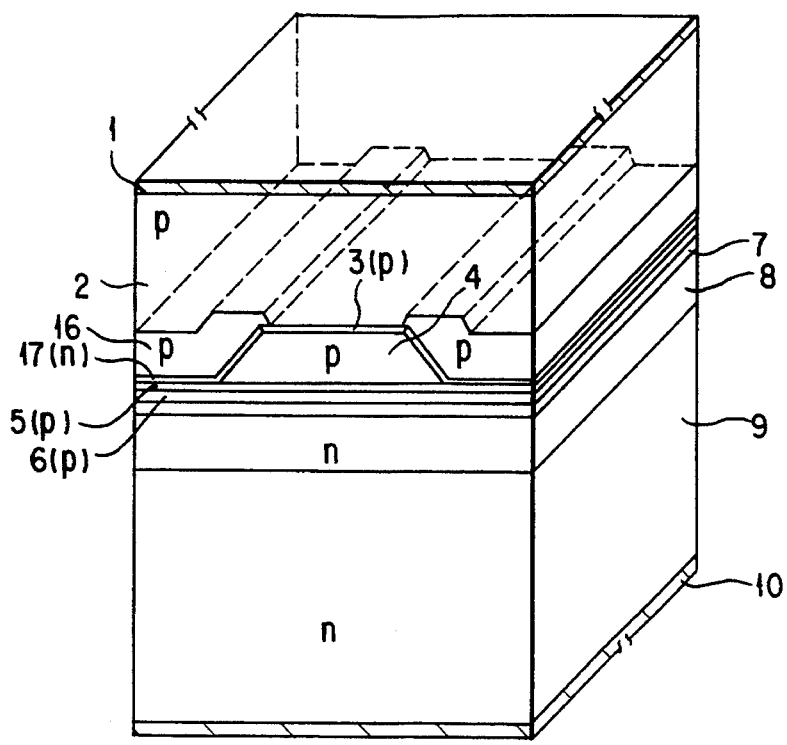
FIG. 5 is a front view showing a structure of a semiconductor laser device according to a third embodiment of the present invention.

FIG. 5 shows a structure of a semiconductor laser device according to a third embodiment of the present invention. The third embodiment is directed to a semiconductor laser device whose optical waveguide differs from that of the SBR structure.

The feature of the semiconductor laser device of the third embodiments lies in that a third clad layer 16 and a current blocking layer 17 are formed in place of the current blocking layer 11 (shown in FIG. 1) of an n-type GaAs layer having a thickness and a carrier concentration enough to prevent a light turn-on phenomenon.

The current blocking layer 17 is formed in contact with part of a second clad layer 5 on the sides of a ridge 4.

The third clad layer 16 is constituted of $(Al_xGa_{1-x})_yIn_{1-y}P$ of a p-type conductivity, such as $(Al_{0.8}Ga_{0.2})_{0.5}In_{0.5}P$. The current blocking layer 17 is constituted of $(Al_xGa_{1-x})_yIn_{1-y}P$ of an n-type conductivity, such as $(Al_{0.8}Ga_{0.2})_{0.5}In_{0.5}P$. Therefore, the aluminum concentration of the third clad layer 16 and current blocking layer 17 is set to be higher than that of the current blocking layer 15 of the device according to the second embodiment (shown in FIG. 4).

The second clad layers 4 and 6 are constituted of $(Al_xGa_{1-x})_yIn_{1-y}P$ of a p-type conductivity, such as $(Al_{0.6}Ga_{0.4})_{0.5}In_{0.5}P$. Therefore, the aluminum concentration of the third clad layer 16 and current blocking layer 17 is higher than that of the second clad layers 4 and 6. In view of the relationship in aluminum concentration, an optical waveguide due to a difference in effective refractive index, is formed immediately under the ridge 4.

Figure 6:
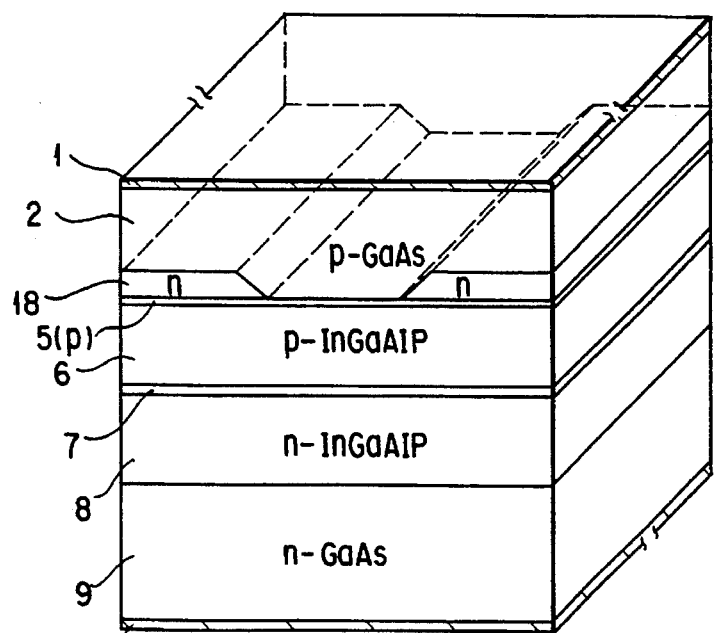
FIG. 6 is a front view showing a structure of a semiconductor laser device according to a fourth embodiment of the present invention.

FIG. 6 shows a structure of a semiconductor laser device according to a fourth embodiment of the present invention. The fourth embodiment is directed to a so-called gain waveguide type semiconductor laser device wherein the ridge 4 of the device of the second embodiment (FIG. 4) is eliminated. In FIG. 6, the same structural elements as those of the device shown in FIG. 1 are denoted by the same reference numerals.

According to the fourth embodiment, the thickness of a second clad layer 6 is about 1 μm and, in this case, a current blocking layer 18 is constituted of $(Al_xGa_{1-x})_yIn_{1-y}P$ of an n-type conductivity, such as $(Al_{0.3}Ga_{0.7})_{0.5}In_{0.5}P$. If, however, the thickness of the second clad layer 6 is set to be 1 μm or more, the light leaking from an active layer 7 does not reach the current blocking layer 18, in other words, a light turn-on phenomenon is not likely to occur. Thus, the current blocking layer 18 can be constituted of GaAs such as $Al_zGa_{1-z}As$ of an n-type conductivity.

Figure 7:
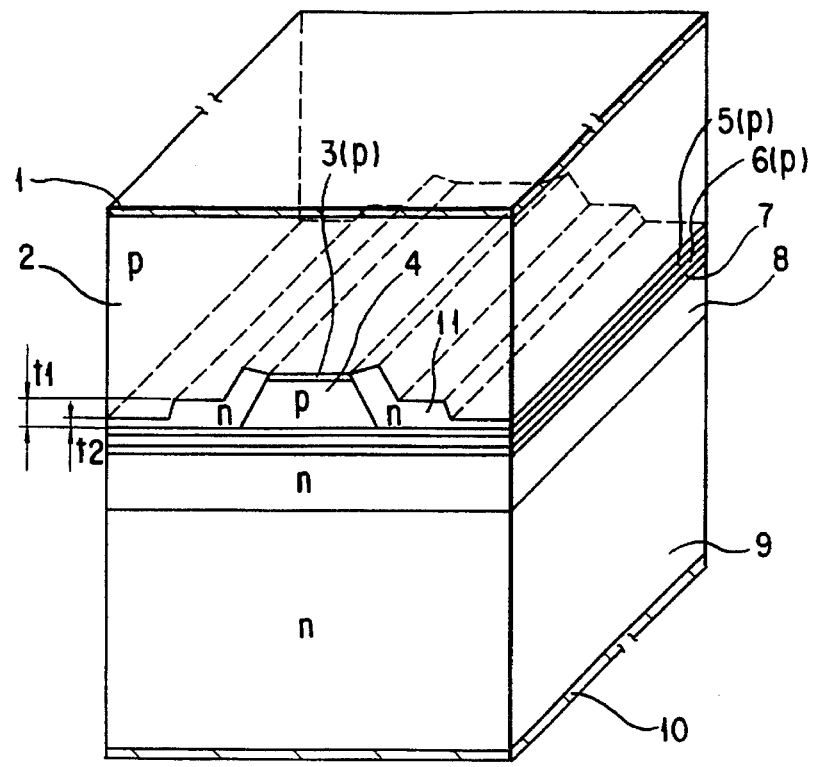
FIG. 7 is a front view showing a structure of a semiconductor laser device according to a fifth embodiment of the present invention.

FIG. 7 shows a structure of a semiconductor laser device according to a fifth embodiment of the present invention. The fifth embodiment is an improvement of the SBR structure shown in FIG. 1. In FIG. 7, the same structural elements as those of the device shown in FIG. 1 are denoted by the same reference numerals.

The feature of the semiconductor laser device of the fifth embodiment lies in that a current blocking layer 11, which is constituted of n-type GaAs, does not have a uniform thickness, and thickness t2 of that portion of the layer 11 which is located the farthest from a light emitting portion (ridge 4) is smaller than thickness t1 of that portion of the layer 11 which is located in the vicinity of the light emitting portion. For example, a thin portion of the current blocking layer 11 is formed the farthest from the ridge 4 and, more specifically, it is formed on the second clad layer 5 which is not influenced by a light beam emitted from an active layer 7 formed immediately under the ridge 4.

The thinner portion of the layer 11 causes a punch through when a predetermined voltage is applied between metallic electrodes 1 and 10 on the p- and n-sides.

The current blocking layer 11 is constituted of n-type GaAs, e.g., either $(Al_xGa_{1-x})_yIn_{1-y}P$ or $Al_zGa_{1-z}As$.

Figure 8:
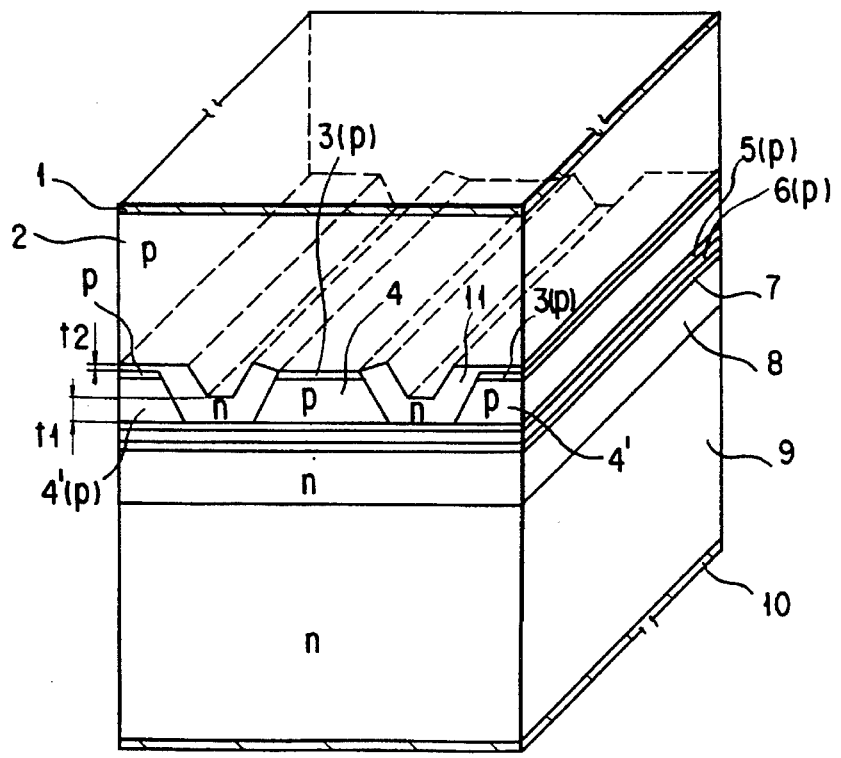
FIG. 8 is a front view showing a structure of a semiconductor laser device according to a sixth embodiment of the present invention.

FIG. 8 shows a structure of a semiconductor laser device according to a sixth embodiment of the present invention. The sixth embodiment is directed to a semiconductor laser device having an SBR structure. In FIG. 8, the same structural elements as those of the device shown in FIG. 1 are denoted by the same reference numerals The first feature of the semiconductor laser device of the sixth embodiment lies in that three ridges 4 and 4' are provided in the middle portion and at the end portions of the device and the second feature thereof lies in that thickness t2 of part of current blocking layer 11, which is located on the ridges 4' at the end portions of the device, is set to be smaller than thickness t1 of the other part of layer 11, which is located between the ridges 4 and 4'.

The thinner part of the current blocking layer 11 causes a punch through when a predetermined voltage is applied between metallic electrodes 1 and 10 on the p- and n-sides.

The current blocking layer 11 is constituted of n-type GaAs, e.g., either of $(Al_xGa_{1-x})_yIn_{1-y}P$ and $Al_zGa_{1-z}As$.

FIG. 9 shows a structure of a semiconductor laser device according to a seventh embodiment of the present invention. The seventh embodiment is a modification to the semiconductor laser device of the fifth embodiment (FIG. 7). In FIG. 9, the same structural elements as those of the device shown in FIG. 7 are denoted by the same reference numerals.

The seventh embodiment differs from the fifth embodiment in that a thin portion of a current blocking layer 11 includes three layers 11a, 11b and 11c.

The carrier concentration and thickness of the middle layer 11b, interposed between the other layers 11a and 11c, are set so as to cause a punch through when a predetermined voltage is applied between metallic electrodes 1 and 10 on the p- and n-sides. Thus, the middle layer 11b fulfills the same function as the thin portion of the current blocking layer 11 of the fifth embodiment.

The material of the middle layer 11b can be selected, irrespective of that of the current blocking layer 11. For example, the layer 11b is constituted of $n^-$-type InGaP and $n^-$-type GaAs.

The layers 11a and 11c interposing the middle layer 11b are $P^-$-type semiconductor layers, and constituted of, for example, $p^-$-type GaAs. These layers 11a and 11c serve to prevent acceptor impurities from diffusing into the middle layer 11b from clad layers 5 and 6 or 3 and 4 and a cap layer 2 which have a relatively high hole concentration (or a high acceptor impurity concentration).

The crystal materials of the impurity diffusion prevention layers 11a and 11c are selected arbitrarily in consideration of the factors of the crystal growth method used when these layers 11a and 11c are formed.

FIG. 10 shows a structure of a semiconductor laser device according to an eighth embodiment of the present invention. The eighth embodiment is a modification to the semiconductor laser device of the sixth embodiment (FIG. 8). In FIG. 10, the same structural elements as those of the device shown in FIG. 8 are denoted by the same reference numerals.

The eighth embodiment differs from the sixth embodiment in that a thin portion of a current blocking layer 11 includes three layers 11a, 11b and 11c.

The carrier concentration and thickness of the middle layer 11b, interposed between the other layers 11a and 11c, are set so as to cause a punch through phenomenon when a predetermined voltage is applied between metallic electrodes 1 and 10 on the p- and n-sides. Thus, the middle layer 11b fulfills the same function as the thin portion of the current blocking layer 11 of the sixth embodiment.

The material of the middle layer 11b is selected arbitrarily in consideration of the factors of a crystal growth method and the like used when the layer 11b is formed. For example, the layer 11b can be constituted of $n^-$-type InGaPa other than n-type GaAs which is the material of the current blocking layer.

The layers 11a and 11c interposing the middle layer 11b are $P^-$-type semiconductor layers and constituted of, for example, $p^-$-type GaAs. These layers 11a and 11c serve to prevent acceptor impurities from diffusing into the middle layer 11b from clad layers 5 and 6 or 3 and 4 and a cap layer 2 which have a relatively high hole concentration (or a high acceptor impurity concentration).

The crystal materials of the impurity diffusion prevention layers 11a and 11c are selected arbitrarily, in view of the factors of the crystal growth method used when these layers 11a and 11c are formed.

In the above embodiments, since a semiconductor layer having a relatively low carrier concentration has to be and can be used for a current blocking layer, the capacity of a reverse junction formed on one interface of the current blocking layer is decreased as compared with that of the conventional structure, with the result that a semiconductor laser device having a smaller parasitic capacitance than that of the prior art device can be achieved.

In the above embodiments, the material of a so-called double heterogeneous junction structure having the active layer 7 and clad layers 3–6 and 8, is $(Al_xGa_{1-x})_yIn_{1-y}P$. However, it can be replaced with the other material, e.g., III–V group crystal such as $Al_xGa_{1-x}As$ and II–VI group crystal such as ZnSe used in a blue semiconductor laser device which is under development. The same is true of the materials of the current blocking layer 11, light absorbing layer 12 and photocurrent blocking layer 13.

According to the present invention described above, since a surge deterioration voltage can be increased, a visible or near-infrared semiconductor laser device having an internal striped structure, which is hard to be destroyed by the surge voltage (current), can be obtained. Furthermore, since a semiconductor layer having a relatively low carrier concentration can be used for the current blocking layer of the present invention, the parasitic capacitance of the semiconductor laser device can be reduced.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor laser device comprising:
   a substrate including a semiconductor crystal of a first conductivity type;
   a first clad layer formed on said substrate and including a semiconductor crystal of the first conductivity type, said first clad layer having a band gap of $Eg_{cl}$ and a refractive index of $n_{cl}$;
   an active layer formed in contact with an upper surface of said first clad layer and including a semiconductor crystal of one of first and second conductivity types, said active layer having a band gap of $Eg_a$ and a refractive index of $n_a$, and $Eg_{cl}$ being larger than $Eg_a$ and $n_{cl}$ being smaller than $n_a$;
   a second clad layer formed in contact with an upper surface of said active layer and including a semiconductor crystal of the second conductivity type, said second clad layer having a band gap of $Eg_{c2}$ and a refractive index of $n_{c2}$, and $Eg_{c2}$ being larger than $Eg_a$ and $n_{c2}$ being smaller than $n_a$;
   a current blocking layer formed on said second clad layer and including a semiconductor crystal of the first conductivity type, said current blocking layer having a band gap of $Eg_{cb}$;
   a slit-shaped current injection opening formed in said current blocking layer;
   a cap layer exposed to said current injection opening, formed on said second clad layer and said current blocking layer, and including a semiconductor crystal of the second conductivity type;
   an upper electrode formed on said cap layer and including metal; and
   a lower electrode formed on an undersurface of said substrate,
   wherein said current blocking layer has a thickness and a carrier concentration such that a depletion layer of a reversed junction formed in said current blocking layer alongside said second clad layer causes a punch through in said current blocking layer when said semiconductor laser device is driven at a current which is one to ten times as large as a maximum rated value of a DC driving current.

2. The semiconductor laser device according to claim 1, further comprising a ridge formed on said second clad layer such that said ridge reaches said current injection opening.

3. The semiconductor laser device according to claim 2, wherein said current blocking layer includes a thin portion away from said ridge, said thin portion being thinner than another portion of said current blocking layer located near said ridge, and causing a punch through when said semiconductor laser device is driven at a current which is one to ten times as large as a maximum rated value of a DC driving current.

4. The semiconductor laser device according to claim 3, wherein the thin portion of said current blocking layer is interposed between said second clad layer and a diffusion prevention layer said diffusion prevention layer preventing impurities from diffusing from said second clad layer and said cap layer into the thin portion of said current blocking layer.

5. The semiconductor laser device according to claim 3, further comprising a ridge formed between said second clad layer and the thin portion of said current blocking layer.

6. The semiconductor laser device according to claim 5, wherein the thin portion of said current blocking layer is interposed between said second clad layer and a diffusion prevention layer, said diffusion prevention layer preventing impurities from diffusing from said second clad layer and said cap layer into the thin portion of said current blocking layer.

7. The semiconductor laser device according to claim 1, wherein the band gap $Eg_a$ of said active layer is smaller than the band gap $Eg_{cb}$ of said current blocking layer.

8. The semiconductor laser device according to claim 1, further comprising:
   a photocurrent blocking layer formed between said current blocking layer and said second clad layer and in contact with said current blocking layer, and including a semiconductor crystal of the second conductivity type, said photocurrent blocking layer having a band gap of $E_{ocb}$ which is larger than the band gap $Eg_a$ of the said active layer; and
   a light absorbing layer formed in contact with said second clad layer and including a semiconductor crystal of the second conductivity type, which is undoped or has a low carrier concentration, said light absorbing layer having a band gap of $E_{ab}$ which is not larger than the band gap $Eg_a$ of said active layer.

9. The semiconductor laser device according to claim 8, wherein:
   the semiconductor crystals of said active layer said first clad layer, said second clad layer and said photocurrent blocking layer are constituted of $(Al_xGa_{1-x})_yIn_{1-y}P$, where $0 \leq x \leq 1$, x varies from layer to layer, and y is about 0.5 for each layer; and
   the semiconductor crystal of said current blocking layer is constituted of one of $(Al_xGa_{1-x})_yIn_{1-y}P$ and $Al_zGa_{1-z}As$.

10. The semiconductor laser device according to claim 9, wherein:
    said first conductivity type is an n-type conductivity, and said second conductivity type is a p-type conductivity; and the semiconductor crystal of said light absorbing layer is constituted of $Al_wGa_{1-w}As$ ($0 \leq w < 1$) of the p-type conductivity, and an impurity concentration of the p-type conductivity is $4 \times 10^{17}$ cm$^{-3}$ or less.

11. The semiconductor laser device according to claim 8, wherein the semiconductor crystals of said active layer, said first clad layer, said second clad layer, said current blocking layer, said light absorbing layer, and said photocurrent blocking layer are constituted of one of a III–V group crystal including $Al_xGa_{1-x}As$ and a II–V group crystal including ZnSe.

12. The semiconductor laser device according to claim 1, wherein a relationship between a thickness $d_{cb}$ and an impurity level concentration $N_{cd}$ of the current blocking layer is expressed by an equation:

$$d_{cb} = [2K\epsilon_{cb}R_{st}I_{max}/qN_{cb}]^{1/2}$$

where $R_{st}$ is a resistance of said slit-shaped current injection opening, $I_{max}$ is the maximum rated value of the DC driving current, $\epsilon_{cb}$ is a dielectric constant of said current blocking layer, and q is a unit charge, $1 \leq K \leq 10$.

13. The semiconductor laser device according to claim 1, wherein said device further comprises a third clad layer of the second conductivity type formed on said current blocking layer; and said third clad layer is constituted of $(Al_xGa_{1-x})_yIn_{1-y}P$, and has an aluminum concentration which is higher than an aluminum concentration of said second clad layer.

* * * * *